US012284783B2

(12) United States Patent
Weltsch et al.

(10) Patent No.: US 12,284,783 B2
(45) Date of Patent: Apr. 22, 2025

(54) DEVICE WITH INTEGRATED LIQUID COOLING SYSTEM

(71) Applicant: Mellanox Technologies Ltd., Yokneam (IL)

(72) Inventors: Oren Weltsch, Harish (IL); Rom Becker, Ramat Yishai (IL); Shay Zaretsky, Kiryat Motzkin (IL); Ayal Shabtay, Haifa (IL); Beeri Halachmi, Kfar Sava (IL); Yuval Blayer, Avtalyon (IL); Kfir Katz, Kiryat Tivon (IL); Yuval Dagan, Gilon (IL); Bar Noyman, Kibbutz Kfar Hachoresh (IL)

(73) Assignee: Mellanox Technologies Ltd., Yokneam (IL)

(*) Notice: Subject to any disclaimer, the term of this patent is extended or adjusted under 35 U.S.C. 154(b) by 173 days.

(21) Appl. No.: 17/534,645

(22) Filed: Nov. 24, 2021

(65) Prior Publication Data

US 2023/0164948 A1 May 25, 2023

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20263* (2013.01); *G06F 2200/201* (2013.01); *H05K 7/20781* (2013.01)

(58) Field of Classification Search
CPC .......... H05K 7/20272; H05K 7/20263; H05K 7/20781; H05K 7/20772; G06F 1/20; G06F 2200/201; G06F 1/181; G06F 1/206
See application file for complete search history.

(56) References Cited

U.S. PATENT DOCUMENTS

| | | | |
|---|---|---|---|
| 7,055,341 B2* | 6/2006 | Nori ...................... | H01L 23/427 165/80.4 |
| 2004/0057211 A1 | 3/2004 | Kondo et al. | |
| 2007/0125523 A1* | 6/2007 | Bhatti ................ | H05K 7/20772 165/80.4 |
| 2017/0265328 A1* | 9/2017 | Sasaki ................ | H05K 7/20781 |
| 2021/0352830 A1* | 11/2021 | Varela Benitez ....... | F04B 19/00 |

* cited by examiner

*Primary Examiner* — Lionel Nouketcha
(74) *Attorney, Agent, or Firm* — PEARL COHEN ZEDEK LATZER BARATZ LLP

(57) ABSTRACT

A device may include: a frame having an interior; an electronic component; a heat conducting body in thermal contact with the electronic component; a conduit containing a liquid coolant, the conduit being coupled to the heat conducting body to deliver the liquid coolant to and from the heat conducting body; and a pump positioned within the interior of the frame, the pump being removably insertable into the interior of the frame and being removably couplable to the conduit to circulate the liquid coolant through the conduit.

18 Claims, 3 Drawing Sheets

DETAIL B

SECTION A-A

DEVICE WITH INTEGRATED LIQUID COOLING SYSTEM

FIELD OF THE INVENTION

The present invention relates to the field of network connection systems, and more particularly, to cooling systems for network switch devices.

BACKGROUND OF THE INVENTION

Typically, network devices in network systems, such as for example network switch devices, include heat producing electronic components that may require cooling. Cooling of heat producing electronic components may be done using air and/or liquid. Air cooling of heat producing electronic components is typically less effective than liquid cooling thereof. For example, air cooling systems typically have smaller maximal power and smaller power density as compared to liquid cooling systems. Liquid cooling of heat producing electronic components typically requires dedicated infrastructure at the network system facility to distribute cooling liquid between network system devices and to cool the cooling liquid. The infrastructure may, for example, include pumps, valves, controllers, cooling towers and other components known in the art. Some network system facilities have no such dedicated infrastructure to support liquid cooling of heat producing electronic components of the network devices.

SUMMARY OF THE INVENTION

Some embodiments of the present invention may provide a device or other component including: a frame having an interior; an electronic component; a heat conducting body in thermal contact with the electronic component; a conduit containing a liquid coolant, the conduit being coupled to the heat conducting body to deliver the liquid coolant to and from the heat conducting body; and a pump positioned within the interior of the frame, the pump being removably insertable into the interior of the frame and being removably couplable to the conduit to circulate the liquid coolant through the conduit.

In some embodiments, the device may include a heat sink positioned within the interior of the frame, wherein at least a portion of the conduit passes through the heat sink.

In some embodiments, the heat sink may include a plurality of fins that are parallel to an axis extending between a first end and a second end of the frame.

In some embodiments, the device may include one or more fan receptacles at a first end of the frame, each of the fan receptacles being configured to removably receive a fan.

In some embodiments, the pump is removably insertable into the interior of the frame through one of the fan receptacles.

In some embodiments, the device may include one or more fans each being removably received within one of the fan receptacles.

In some embodiments, the device may include a coupler having a first dripless blind-mate connector and a second dripless blind-mate connector to removably couple the pump to the conduit.

In some embodiments, the device may include a second pump positioned within the interior of the frame, the second pump being coupled to the conduit to circulate the liquid coolant through the conduit.

In some embodiments, the device may include a coupler to couple in parallel the pump and the second pump to the conduit.

In some embodiments, the coupler may include: a first dripless blind-mate connector and a second dripless blind-mate connector to removably couple the pump to the conduit, and a third dripless blind-mate connector and a fourth dripless blind-mate connector to removably couple the second pump to the conduit.

In some embodiments, the device may include a controller to control the pump and the second pump to maintain a desired flow rate of the liquid coolant through the conduit.

In some embodiments, the controller is a central processing unit (CPU) of the device.

In some embodiments, the device is a network switch device.

Some embodiments of the present invention may provide a device including: a housing having: a first end, a second end, and an interior; a heat producing component or device; a cooling body in thermal contact with the heat producing component; a conduit containing a coolant, the conduit being coupled to the cooling body to deliver the coolant to and from the cooling body; a heat exchanger positioned within the interior of the housing and having at least a portion of the conduit passing therethrough; one or more fan openings at the first end of the housing; one or more fans each being removably received within one of the fan openings; and a first pump and a second pump positioned within the interior of the housing, the first pump and the second pump being removably insertable into the interior of the housing through one of the fan openings and being removably couplable in parallel to the conduit to circulate the coolant through the conduit.

In some embodiments, the device may include a coupler including: a first dripless blind-mate connector and a second dripless blind-mate connector to removably couple the first pump to the conduit, and a third dripless blind-mate connector and a fourth dripless blind-mate connector to removably couple the second pump to the conduit.

In some embodiments, the heat exchanger may include a heat sink.

In some embodiments, the heat sink may include a plurality of fins that are parallel to an axis extending between the first end and the second end of the housing.

In some embodiments, the device may include a controller to control the first pump and the second pump to maintain a desired flow rate of the coolant through the conduit.

In some embodiments, the controller controlling the one or more fans to maintain a desired flow rate of air into the interior of the housing.

In some embodiments, the controller is a central processing unit (CPU) of the device.

In some embodiments, the device is a network switch device.

Some embodiments of the present invention may provide a device including: a frame; a heat producing device; a cooling body in contact with the heat producing device; a coolant conduit delivering coolant to the cooling body; and a pump positioned within the frame, to circulate the liquid coolant in the conduit.

In some embodiments, the device is a network switch device.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings.

Figures 1, 2:
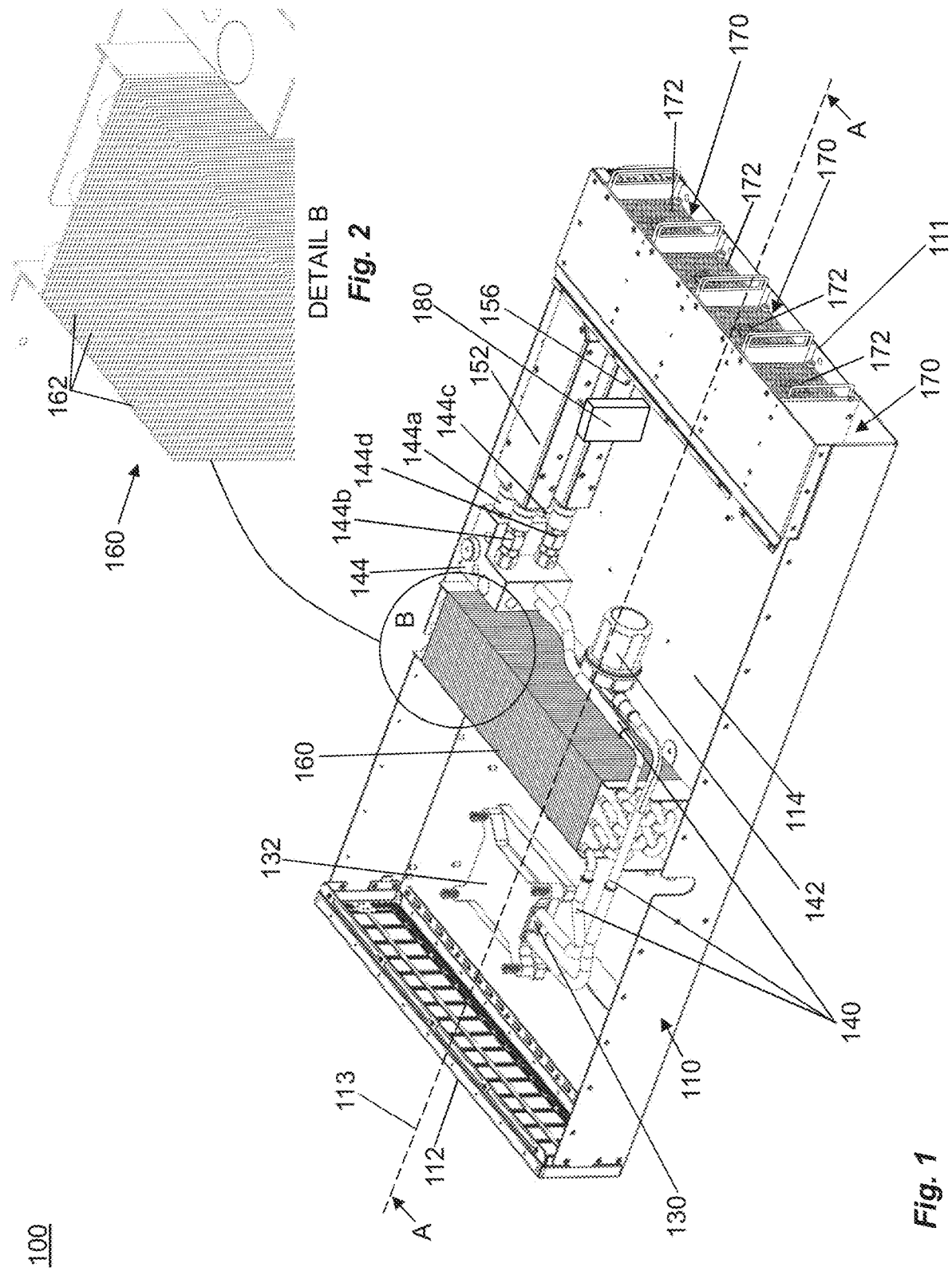
FIG. 1 is a three-dimensional (3D) diagram of a network switch device, according to some embodiments of the invention.
FIG. 2 is a 3D diagram of an enlarged portion of a heat exchanger or heat sink of the network switch device, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Reference is now made to FIG. 1, which is a three-dimensional (3D) diagram of a network switch device 100, according to some embodiments of the present invention.

Reference is also made to FIG. 2, which is a 3D diagram of an enlarged portion of a heat exchanger or heat sink 160 of network switch device 100, according to some embodiments of the present invention.

Figure 3:
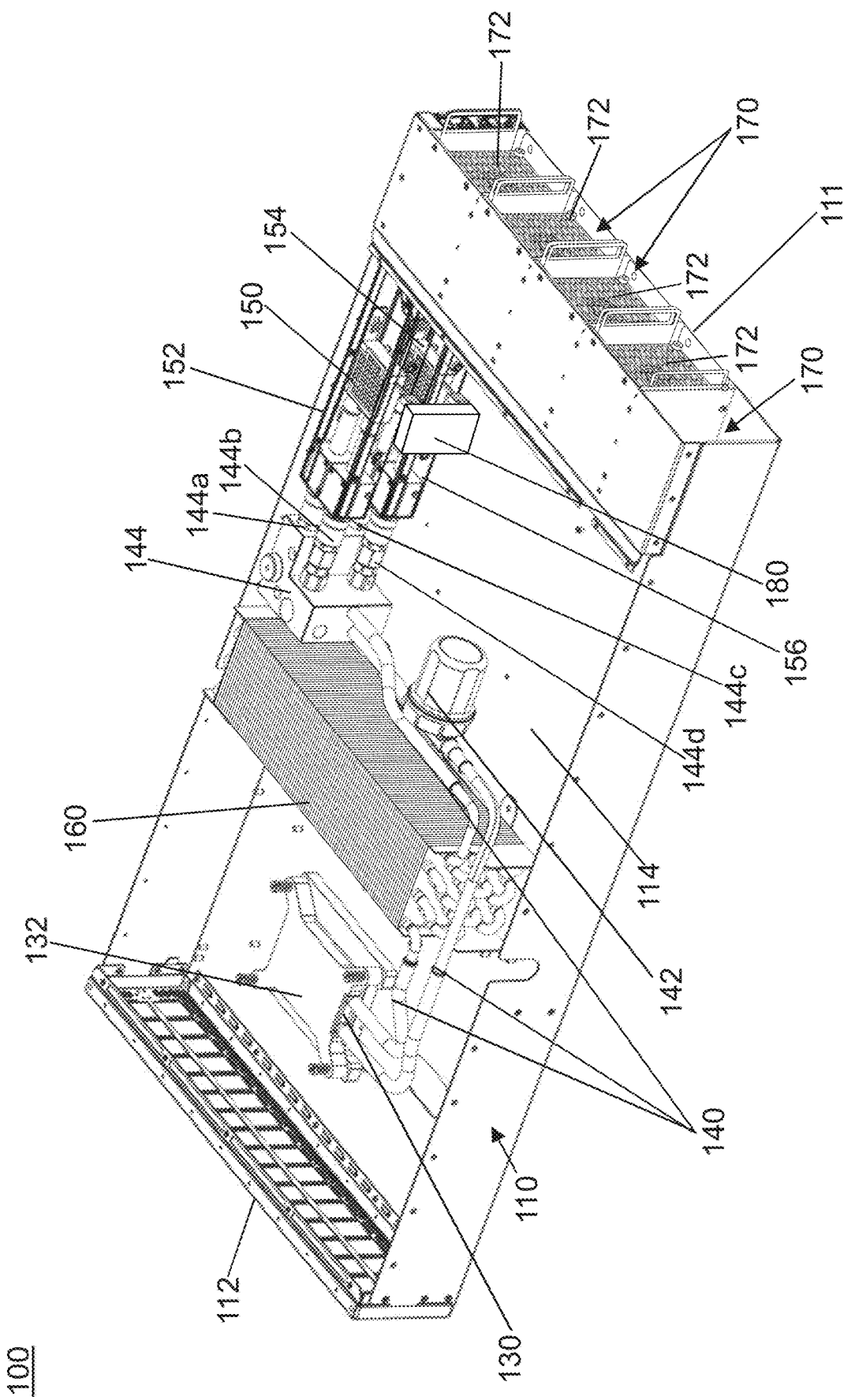
FIG. 3 is a 3D diagram of the network switch device showing transparent view of pump sub-frames, according to some embodiments of the invention.

Reference is also made to FIG. 3, which is a 3D diagram of network switch device 100 showing transparent view of pump sub-frames 152, 156, according to some embodiments of the present invention.

Figure 4:
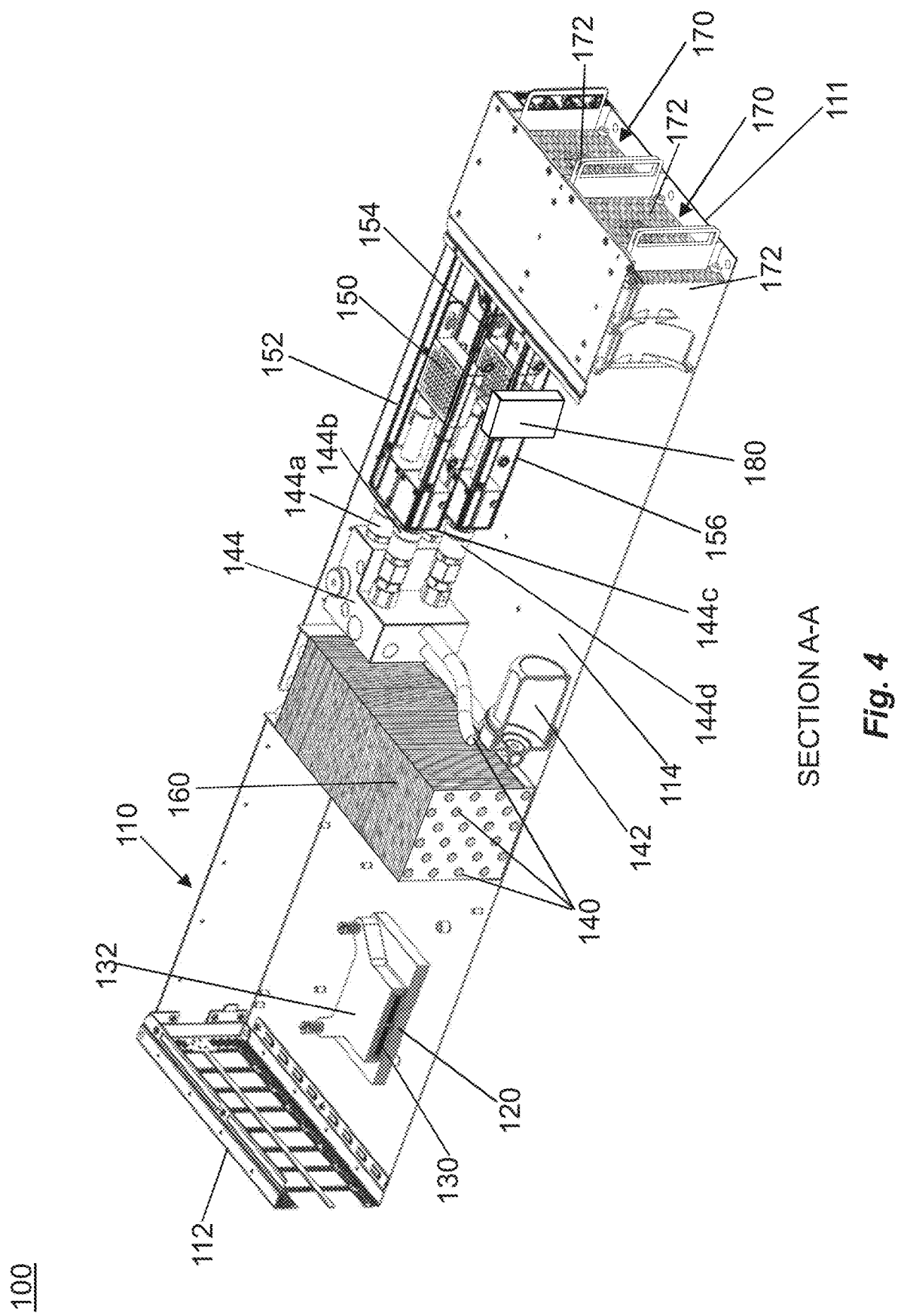
FIG. 4 is a 3D diagram of a section view, along line A-A of FIG. 1, of the network switch device, according to some embodiments of the present invention.

Reference is also made to FIG. 4, which is a 3D diagram of a section view, along line A-A of FIG. 1, of network switch device 100, according to some embodiments of the present invention.

According to some embodiments of the present invention, network switch device 100 may include a frame or housing 110, an electronic component or device or heat producing component 120, a heat conducting or cooling body 130, a conduit 140 and a pump 150. While device 100 is described as a network switch device, other devices may include components as described herein.

Frame or housing 110 may have a first end 111, a second end 112 and an interior 114. Electronic component 120 may be positioned within interior 114 of frame or housing 110. Electronic component 120 may produce heat. For example, electronic component 120 may be a central processing unit (CPU), graphics processing unit (GPU), networking application-specific integrated circuit (ASIC) or any other heat producing electronic component of network switch device 100.

Heat conducting or cooling body 130 may be in thermal contact with electronic component 120. Heat conducting or cooling body 130 may be made of or may include material such as, for example, copper, aluminum or stainless steel. For example, heat conducting or cooling body 130 may contact, directly or indirectly, electronic component 120 to cause heat to dissipate from electronic component 120 to heat conducting or cooling body 130. In some embodiments, network switch device 100 may include a heat conducting or cooling body sub-frame 132 to couple heat conducting or cooling body 130 to frame or housing 110 and/or to secure the position of heat conducting or cooling body 130 with respect to electronic component 120.

Conduit 140, e.g., a pipe, tube, possibly in one or more connected sections, may contain a coolant, for example, a liquid coolant. The coolant may, for example, be or include water (e.g., pure water) or water solutions (e.g., glycol-water). Conduit 140 may be coupled to or be in contact with heat conducting or cooling body 130. Conduit 140 may deliver the coolant to and from heat conducting or cooling body 130. In some embodiments, conduit 140 includes two or more interconnected conduit portions. In some embodiments, network switch device 100 may include an expansion tank 142 coupled to or in contact with conduit 140.

Pump 150 may be positioned within interior 114 of frame or housing 110. For example, pump 150 may be positioned adjacent (or substantially adjacent) to first end 111 of frame or housing 110. Pump 150 may be coupled to conduit 140 to circulate the coolant through conduit 140 and to deliver the coolant to and from heat conducting or cooling body 130. Pump 150 may be, for example, direct current pump having controllable rotational speed and rotational speed feedback circuitry.

Network switch device 100 may include a heat exchanger or heat sink 160. Heat exchanger or heat sink 160 may be positioned within interior 114 of frame or housing 110. In some embodiments, heat exchanger or heat sink 160 may include a plurality of fins 162. Fins 162 may be parallel (or substantially parallel) to an axis 113 extending between first end 111 and second end 112 of frame or housing 110. At least a portion of conduit 140 may pass through heat exchanger or heat sink 160. For example, the portion of conduit 140 passing through heat exchanger or heat sink 160 may be curved such that two or more turns of conduit 140 pass through heat exchanger or heat sink 160.

Network switch device 100 may include one or more fan receptacles or openings 170 at first end 111 of frame or housing 110. Each of fan receptacles or openings 170 may removably receive a fan. Network switch device 100 may include one or more fans 172 each being removably received within one of fan receptacles or openings 170.

In some embodiments, pump 150 may be removably inserted into interior 114 of frame or housing 110 through one of fan receptacles or openings 170. In some embodiments, network switch device 100 may include a coupler 144 to removably couple pump 150 to conduit 140. Coupler 144 may, for example, include a first dripless blind-mate connector 144a and a second dripless blind-mate connector 144b to removably couple pump 150 to conduit 140. In some embodiments, pump 150 may be positioned within a pump sub-frame 152. Pump-sub-frame 152 may be removably coupled (e.g., using bolts) to frame or housing 110. Pump sub-frame 152 may have dimensions that are smaller than dimensions of fan receptacles or openings 170 to removably insert pump sub-frame 152 into interior 114 of frame or housing 110 through one of fan receptacles or openings 170. Pump sub-frame 152 may ensure proper position of pump 150 with respect to conduit 140 and/or coupler 144.

In operation, electronic component 120 of network switch device 100 may produce heat. Pump 150 may circulate the coolant through conduit 140 to deliver the coolant to and from heat conducting or cooling body 130 being in thermal contact with electronic component 120. Heat being produced by electronic component 120 may dissipate from electronic component 120 through heat conducting or cooling body 130 to the coolant to cool the electronic component 120. Fans 172 may draw air into interior 114 of frame or housing 110. The air may flow through heat exchanger or heat sink 160 to cause heat to dissipate from the coolant through the portion of conduit 140 passing through heat exchanger or heat sink 160 to the air to cool the coolant.

In various embodiments, network switch device 100 may include a controller 180 to control pump 150 and/or fans 172. In various embodiments, the CPU of network switch device 100 may control pump 150 and/or fans 172.

Controller 180 and/or the CPU of network switch device 100 may control rotational speed of pump 150 to generate and maintain a desired flow rate of the coolant through conduit 140. In some embodiments, pump 150 may include a rotational speed feedback circuitry. The rotational speed feedback circuitry may output a signal indicative of the actual rotational speed of pump 150. Controller 180 and/or the CPU of network switch device 100 may receive the signal and send signals to pump 150 to control pump 150 based on the signal from the rotational speed feedback circuitry of the respective pump. In some embodiments, network switch device 100 may include a flow rate sensor to measure the flow rate of the coolant through conduit 140 and to generate an output signal related thereto. Controller 180 and/or the CPU of network switch device 100 may control pump 150 further based on the output signal from the flow rate sensor. In various embodiments, controller 180 and/or the CPU of network switch device 100 may issue a notification if the rotational speed of pump 150 or decreases below a predefined threshold.

Controller 180 and the CPU of network switch device 100 may control rotational speed of fans 172 based on a temperature of one or more components of network switch device 100. For example, electronic component 120 may include a temperature sensor to measure a temperature of electronic component 120 and generate an output signal related thereto. Controller 180 and/or the CPU of network switch device 100 may, for example, detect that the temperature of electronic component 120 increases above a predefined threshold (e.g., based on the output signal from the temperature sensor of electronic component 120) and control fans 172 to increase their respective rotational speed to increase the flow rate of air through heat exchanger or heat sink 160. Increased flow rate of air through heat exchanger or heat sink 160 may enhance the cooling of the coolant flowing through conduit 140, which in turn may enhance the cooling of electronic component 120. In some embodiments, network switch device 100 may include a coolant temperature sensor to measure the temperature of the coolant in conduit 140 and generate an output signal related thereto. Controller 180 and/or the CPU of network switch device 100 may control the rotational speed of fans 172 further based on the output signal from the coolant temperature sensor to maintain the desired temperature of the coolant.

In some embodiments, each of fans 172 may include a rotational speed feedback circuitry. The rotational speed feedback circuitry may output a signal indicative of the actual rotational speed of the respective fan. Controller 180 and/or the CPU of network switch device 100 may receive the signal and output a signal to control fans 172 based on the signals from rotational speed feedback control circuities of fans 172. For example, if controller 180 and/or the CPU of network switch device 100 detects that the rotational speed of one of fans 172 has smaller value than a preset value thereof, controller 180 and/or the CPU of network switch device 100 may control other fans 172 to increase their respective rotational speeds to maintain the desired flow rate the air through heat exchanger or heat sink 160. In some embodiments, controller 180 and/or the CPU of network switch device 100 may issue a notification if the rotational speed of one of fans 172 decreases below a predefined threshold.

In some embodiments, network switch device 100 may include a second pump 154. Pump 154 may be, for example, direct current pump having controllable rotational speed and rotational speed feedback circuitry. Pump 154 may be positioned within interior 114 of frame or housing 110. For example, pump 154 may be positioned adjacent (or substantially adjacent) to first end 111 of frame or housing 110. Pump 154 may be removably inserted into interior 114 of frame or housing 110 through one of fan receptacles or openings 170, for example through the same fan receptacle or opening 170 being used to insert and remove pump 150 into/from interior 114 of frame or housing 110. In some embodiments, coupler 144 may include a third dripless blind-mate connector 144c and a fourth dripless blind-mate connector 144d to removably couple pump 154 to conduit 140. For example, coupler 144 may couple in parallel pump 150 and pump 154 to conduit 140. In some embodiments, pump 154 may be positioned within a second pump sub-frame 156. Pump sub-frame 156 may be removably coupled (e.g., using bolts) to frame or housing 110. Pump sub-frame 156 may have dimensions that are smaller than dimensions of fan receptacles or openings 170 to removably insert pump sub-frame 156 into interior 114 of frame or housing 110 through one of fan receptacles or openings 170. Pump sub-frame 156 may ensure proper position of pump 154 with respect to conduit 140 and/or coupler 144. Although two pumps 150, 154 are shown in FIGS. 1-4, it is to be understood that in various embodiments, network switch device 100 may include a single pump or more than two pumps.

Controller 180 and/or the CPU of network switch device 100 may control rotational speeds of pump 150 and pump 154 to generate and maintain the desired flow rate of the coolant through conduit 140. Controller 180 and/or the CPU of network switch device 100 may control pump 150 and pump 154 based on, for example, output signals from rotational speed feedback circuities of pump 150 and pump 154 and/or based on the output signal from the flow rate sensor (e.g., as described hereinabove). For example, if controller 180 and/or the CPU of network switch device 100 detects that the rotational speed of one of pump 150 or pump 154 has smaller value than a preset value thereof, controller 180 and/or the CPU of network switch device 100 may control another pump of pump 150 or pump 154 to increase its respective rotational speed to maintain the desired flow rate of the coolant through conduit 140. In various embodiments, controller 180 and/or the CPU of network switch device 100 may issue a notification if the rotational speed of one of pump 150 and/or pump 154 decreases below a predefined threshold. The rotational speed which is below the predefined threshold may be indicative of, for example, a malfunction of the respective pump.

In operation, if the rotational speed of one of pump 150 or pump 154 reduces below the predefined threshold, the respective pump (e.g., referred herein below as "faulty pump") may be replaced with new pump without terminating the operation of network switch device 100. For example, one of fans 172 may be removed from its respective fan receptacle or opening and the faulty pump may be decoupled from coupler 144 and pulled external to frame or housing 110 through the respective fan receptacle or opening. Once one of fans 172 is removed, controller 180 and/or the CPU of network switch device 100 may increase rotational speeds of remaining fans 172 to maintain the desired flow rate of air through heat exchanger or heat sink 160. Once the faulty pump is decoupled from conduit 140/coupler 144, dripless blind-mate connectors to which the faulty pump was coupled may prevent the coolant from leaking external to conduit 140. Once the faulty pump is decoupled from conduit 140/coupler 144, controller 180 and/or the CPU of network switch device 100 may increase the rotational speed of the remaining pump to maintain the desired flow rate of the coolant through conduit 140. New pump may be inserted into interior 114 of frame or housing 110 through the respective fan receptacle or opening and coupled to conduit 140/coupler 144 by the respective dripless blind-mate connectors. The fan that has been removed may be inserted back to the respective fan receptacle or opening. Controller 180 and/or the CPU of network switch device 100 may control the pumps and the fans in a normal mode of operation, e.g., as described hereinabove.

Advantageously, the disclosed network switch device 100 includes integrated liquid cooling system and does not require any external infrastructure for supporting the liquid cooling thereof. Furthermore, in some embodiments, network switch device 100 may include two pumps 150, 154 being coupled in parallel using dripless blind-mate connectors to conduit 140 delivering the coolant to and from heat conducting or cooling body 130 being in thermal contact with heat producing component 120 of network stich device 100. In the case of malfunction of one of pumps 150, 154, the faulty pump may be replaced with new pump through one of fan receptacles or openings 170 without terminating the operation of network switch device 100 (e.g., as described hereinabove).

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A device comprising:
   a frame having an interior;
   an electronic component;
   a heat conducting body in thermal contact with the electronic component;
   a conduit containing a liquid coolant, the conduit being coupled to the heat conducting body to deliver the liquid coolant to and from the heat conducting body;
   a heat sink positioned within the interior of the frame, wherein at least a portion of the conduit passes through the heat sink, and wherein the heat sink comprises a plurality of fins that are parallel to an axis extending between a first end and a second end of the frame; and
   a first pump and a second pump positioned within the interior of the frame, the first pump and the second pump being removably insertable into the interior of the frame and being removably couplable to the conduit to circulate the liquid coolant through the conduit;
   wherein the first pump and the second pump are positioned one above the other relative to a bottom surface of the frame and along a side wall of the frame.

2. The device of claim 1, further comprising one or more fan receptacles at a first end of the frame, each of the fan receptacles being configured to removably receive a fan.

3. The device of claim 2, wherein the pump is removably insertable into the interior of the frame through one of the fan receptacles.

4. The device of claim 3, further comprising a coupler having a first dripless blind-mate connector and a second dripless blind-mate connector to removably couple the pump to the conduit.

5. The device of claim 2, comprising one or more fans, wherein each fan of the one or more fans is removably received within one of the fan receptacles.

6. The device of claim 1, further comprising a coupler to couple in parallel the pump and the second pump to the conduit.

7. The device of claim 6, wherein the coupler comprises:
a first dripless blind-mate connector and a second dripless blind-mate connector to removably couple the pump to the conduit, and
a third dripless blind-mate connector and a fourth dripless blind-mate connector to removably couple the second pump to the conduit.

8. The device of claim 1, further comprising a controller to control the pump and the second pump to maintain a desired flow rate of the liquid coolant through the conduit.

9. The device of claim 8, wherein the controller is a central processing unit (CPU) of the device.

10. The device of claim 1, being a network switch device.

11. A device comprising:
a housing having: a first end, a second end, and an interior;
a heat producing component;
a cooling body in thermal contact with the heat producing component;
a conduit containing a coolant, the conduit being coupled to the cooling body to deliver the coolant to and from the cooling body;
a heat exchanger positioned within the interior of the housing and having at least a portion of the conduit passing therethrough;
one or more fan openings at the first end of the housing;
one or more fans, wherein each fan of the one or more fans is removably received within one of the fan openings; and
a first pump and a second pump positioned within the interior of the housing, the first pump and the second pump being removably insertable into the interior of the housing through one of the fan openings and being removably couplable in parallel to the conduit to circulate the coolant through the conduit;
wherein the first pump and the second pump are positioned one above the other relative to a bottom surface of the housing and along a side wall of the housing.

12. The device of claim 11, further comprising a coupler comprising:
a first dripless blind-mate connector and a second dripless blind-mate connector to removably couple the first pump to the conduit, and
a third dripless blind-mate connector and a fourth dripless blind-mate connector to removably couple the second pump to the conduit.

13. The device of claim 11, wherein the heat exchanger comprises a heat sink and wherein the heat sink comprises a plurality of fins that are parallel to an axis extending between the first end and the second end of the housing.

14. The device of claim 11, further comprising a controller to control the first pump and the second pump to maintain a desired flow rate of the coolant through the conduit.

15. The device of claim 14, wherein the controller controlling the one or more fans to maintain a desired flow rate of air into the interior of the housing.

16. The device of claim 14, wherein the controller is a central processing unit (CPU) of the device.

17. The device of claim 11, being a network switch device.

18. A device comprising:
a frame having an interior;
a heat producing device;
a cooling body in contact with the heat producing device;
a coolant conduit delivering coolant to the cooling body;
a heat sink positioned within the interior of the frame, wherein at least a portion of the coolant conduit passes through the heat sink, and wherein the heat sink comprises a plurality of fins that are parallel to an axis extending between a first end and a second end of the frame; and
a first pump and a second pump positioned within the interior of the frame to circulate the liquid coolant in the conduit, the first pump and the second pump being positioned one above the other relative to a bottom surface of the frame and along a side wall of the frame.

* * * * *